United States Patent
Ogawa et al.

[11] 3,970,572
[45] July 20, 1976

[54] FERROELECTRIC CERAMIC COMPOSITION

[75] Inventors: Toshio Ogawa; Mutsuo Munekata; Kenji Ozawa; Kiichi Minai, all of Nagaokakyo, Japan

[73] Assignee: Murata Manufacturing Co., Ltd., Japan

[22] Filed: Dec. 12, 1974

[21] Appl. No.: 532,160

[30] Foreign Application Priority Data
Dec. 12, 1973 Japan............................ 48-140994
Oct. 1, 1974 Japan............................ 49-113584

[52] U.S. Cl. ............................................. 252/62.9
[51] Int. Cl.² ................... C04B 35/46; C04B 35/48
[58] Field of Search ................................. 252/62.9

[56] References Cited
UNITED STATES PATENTS
3,518,199  6/1970  Tsubouchi et al. ................. 252/62.9
3,528,918  9/1970  Nishida et al. ..................... 252/62.9
3,595,795  7/1971  Tsubouchi et al. ................. 252/62.9

FOREIGN PATENTS OR APPLICATIONS
1,580,831  9/1969  France ............................. 252/62.9

Primary Examiner—Jack Cooper
Attorney, Agent, or Firm—Stewart and Kolasch, Ltd.

[57] ABSTRACT

A ferroelectric ceramic composition of a ternary system solid solution represented by the general formula:

$$xPb(Sn_\alpha Sb_{1-\alpha})O_3 - yPbTiO_3 - zPbZrO_3$$

wherein $x$, $y$ and $z$ are the respective mol fractions of the components, $x + y + z = 1.00$ and $\frac{1}{4} \leq \alpha \leq \frac{3}{4}$.

5 Claims, 8 Drawing Figures

FERROELECTRIC CERAMIC COMPOSITION

This invention relates to ferroelectric ceramic compositions of a ternary system Pb(Sn$_\alpha$ Sb$_{1-\alpha}$)O$_3$—PbTiO$_3$—PbZrO$_3$ which is stable in piezoelectric characteristics.

It is known that ceramic compositions of the system PbTiO$_3$—PbZrO$_3$ exhibit desirable piezoelectric characteristics useful for use as piezoelectric ceramic materials, and various kinds of modified ceramics have been reported. These ceramic materials are roughly divided into two main groups, i.e., a hard type and a soft type. One of the representatives of the hard type is a ceramic material of the system PbTiO$_3$—PbZrO$_3$ containing Mn, Fe or Ni and that of the soft type is a ceramic material of the system PbTiO$_3$—PbZrO$_3$ containing Nb or Sb. These ceramic materials exhibit desirable piezoelectric characteristics, but the ceramic materials of the soft type have advantages such as that the aging thereof is extremely great. For example, if a ceramic material of the soft type was compulsorily exposed to heat aging at 150°C, its piezoelectric characteristics such as the electromechanical coupling coefficient kp deteriorate greatly in proportion to the repeated times of application of the heat aging. It is therefore considerably difficult to obtain ceramic products having desired characteristics, for example, such as ceramic filters for the objective frequency.

It is therefore an object of the present invention to provide ferroelectric ceramic compositions of which the aging is very small while they are of the soft type.

According to this invention, there is provided a ferroelectric ceramic composition of a ternary system Pb(Sn$_\alpha$ Sb$_{1-\alpha}$)O$_3$—PbTiO$_3$—PbZrO$_3$ comprising a solid solution represented by the general formula:

$$x\text{Pb}(\text{Sn}_\alpha \text{Sb}_{1-\alpha})\text{O}_3 - y\text{PbTiO}_3 - z\text{PbZrO}_3$$

wherein
$x + y + z = 1.00$
$\frac{1}{4} \leq \alpha \leq \frac{3}{4}$
said composition being in a polygonal area defined by the points A, B, C, D, E and F in FIG. 1, the sets of mol fractions of the three components at said points being as follows:

|   | x    | y    | z    |
|---|------|------|------|
| A | 0.01 | 0.60 | 0.39 |
| B | 0.01 | 0.30 | 0.69 |
| C | 0.15 | 0.25 | 0.60 |
| D | 0.25 | 0.25 | 0.50 |
| E | 0.25 | 0.50 | 0.25 |
| F | 0.15 | 0.60 | 0.25 |

If the value of $\alpha$ is less than ½, several problems arise along with it. It is therefore preferred to limit the compositional area in response to the value of $\alpha$ as follows:

When $\frac{1}{3} \leq \alpha < \frac{1}{2}$, it is preferred to limit the compositional area to a polygonal area defined by the points A, B, C, D$_1$, E$_1$, and F in FIG. 1, the sets of mol fractions of the three components at said points being as follows:

|   | x    | y    | z    |
|---|------|------|------|
| A | 0.01 | 0.60 | 0.39 |
| B | 0.01 | 0.30 | 0.69 |
| C | 0.15 | 0.25 | 0.60 |
| D$_1$ | 0.20 | 0.25 | 0.55 |
| E$_1$ | 0.20 | 0.55 | 0.25 |
| F | 0.15 | 0.60 | 0.25 |

When $\frac{1}{4} \leq \alpha < \frac{1}{3}$, it is preferred to limit the compositional area to a polygonal area defined by the points A, B, C, D$_2$, E$_2$ and F in FIG. 1, the sets of mol fractions of the three components at said points being as follows:

|   | x    | y    | z    |
|---|------|------|------|
| A | 0.01 | 0.60 | 0.39 |
| B | 0.01 | 0.30 | 0.69 |
| C | 0.15 | 0.25 | 0.60 |
| D$_2$ | 0.15 | 0.35 | 0.50 |
| E$_2$ | 0.15 | 0.50 | 0.35 |
| F | 0.15 | 0.60 | 0.25 |

The piezoelectric ceramics according to the invention may be prepared in a manner conventionally adapted for the preparation of piezoelectric ceramics.

The piezoelectric ceramics which are the compositions of a ternary system Pb(Sn$_\alpha$ Sb$_{1-\alpha}$)O$_3$—PbTiO$_3$—PbZrO$_3$ have high resistance to heat aging, in other words, high thermostability in piezoelectric characteristics such as electromechanical coupling coefficient(kp), mechanical quality factor (Qm) and dielectric constant($\epsilon_s$). In addition, if they are applied to energy trapped mode ceramic resonators, the difference ($\Delta$f) between the antiresonance frequency (fa) and resonance frequency (fo) varies scarcely. Moreover, the temperature coefficients (TC) of the antiresonance and resonance frequencies of the piezoelectric ceramics are small in wide compositional area. Thus, these ceramics according to the present invention are suitable for use as ceramic filters, vibrators, acoustic elements, piezoelectric ignition elements and the like.

The invention will be further apparent from the following description with reference to examples and the accompanying drawings, in which.

EXAMPLES

Figure 1:
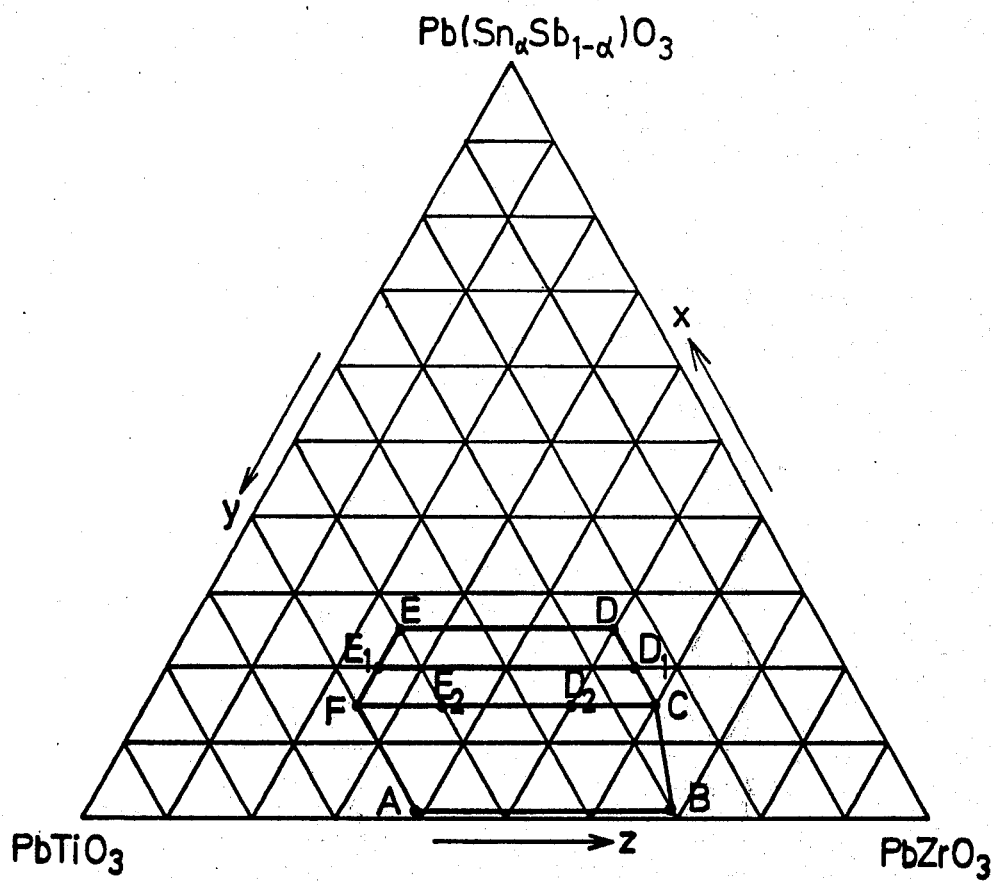
FIG. 1 is a triangular diagram showing the area of the ferroelectric ceramic compositions according to the invention.
Figure 2:
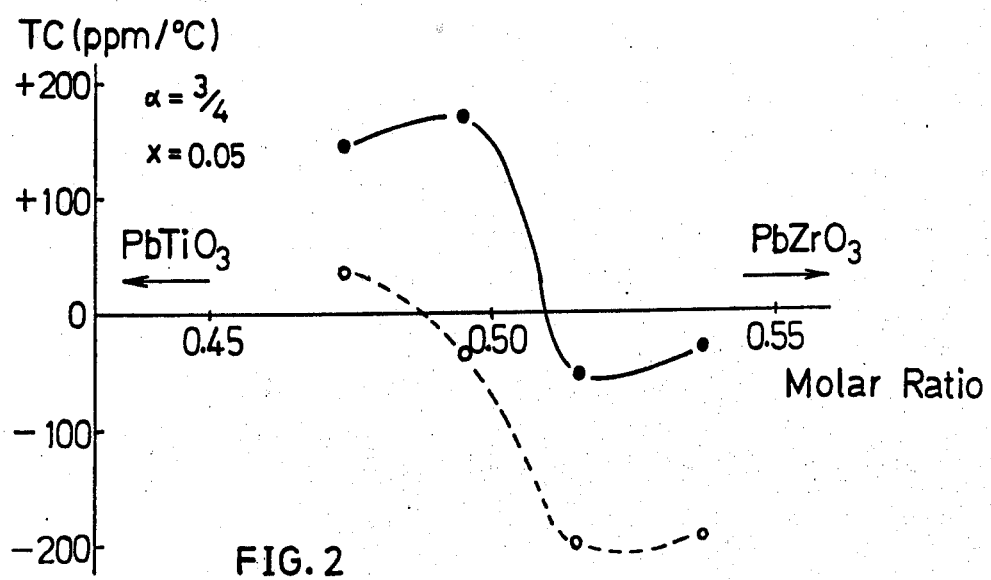
FIGS. 2 through 7 are the graphs showing the changes of the temperature coefficient of frequencies (from −20°C to +80°C) as a function of molar ratio of PbTiO$_3$/PbZrO$_3$.
Figure 3:
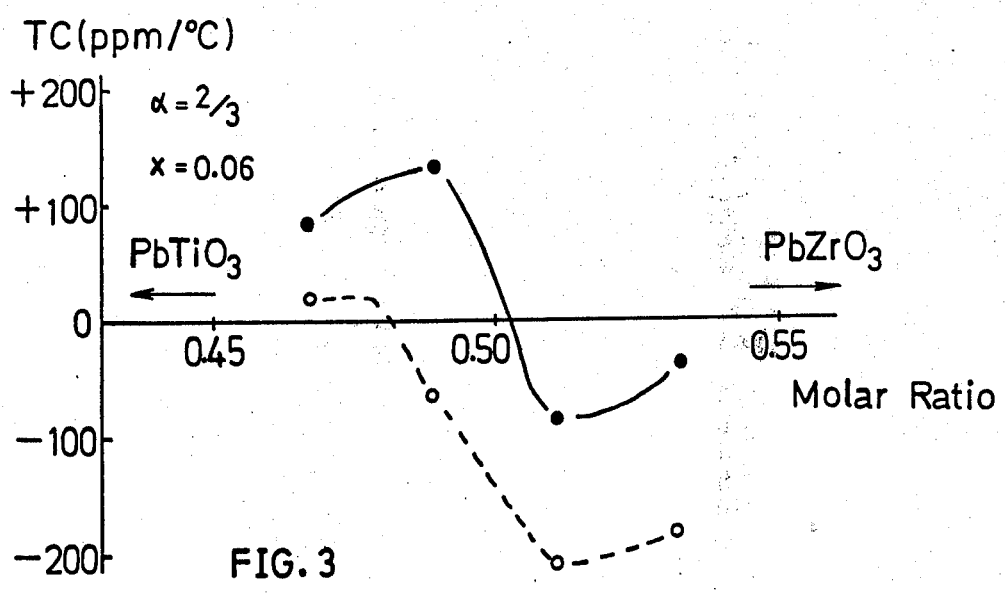
Figure 4:
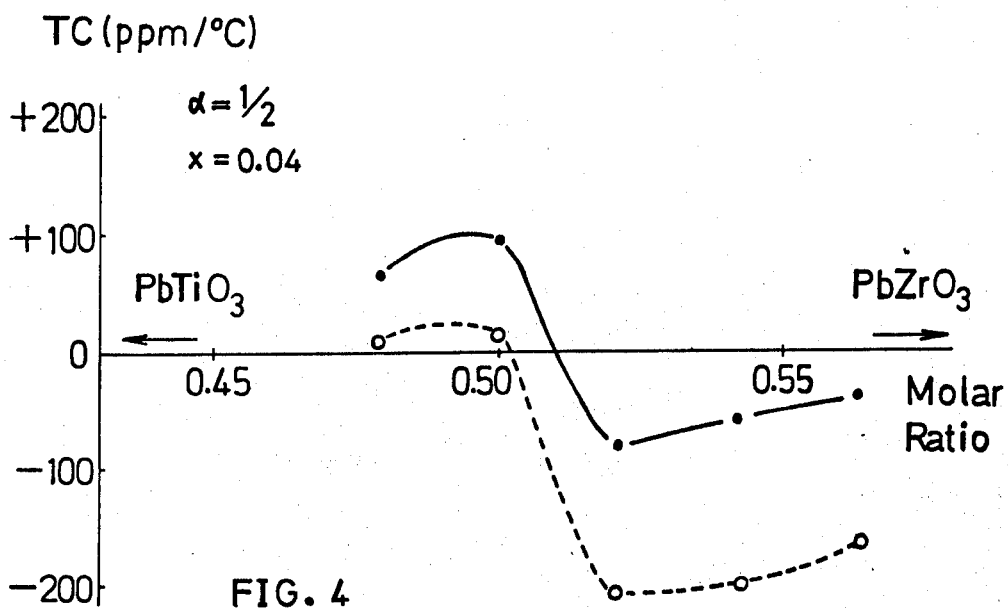
Figure 5:
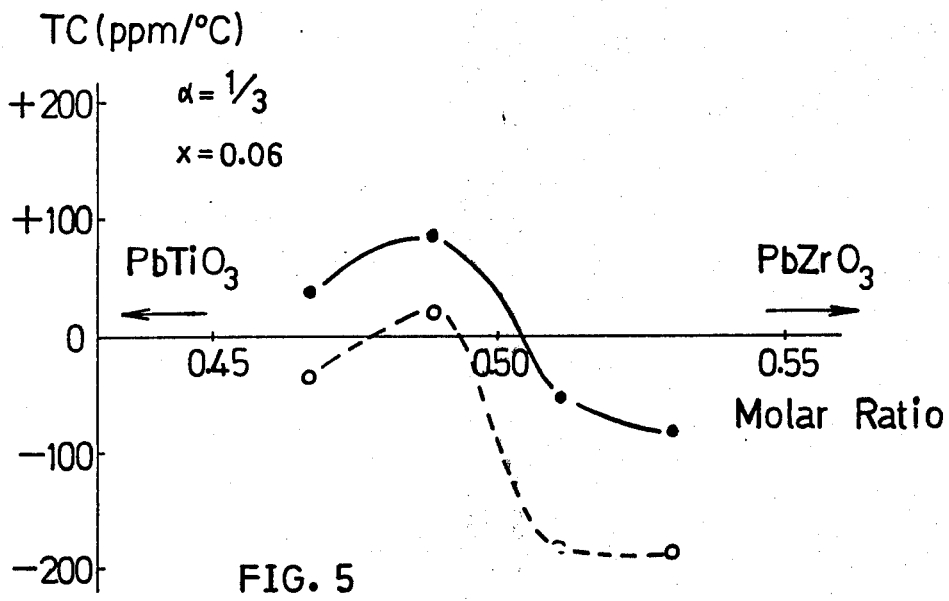
Figure 6:
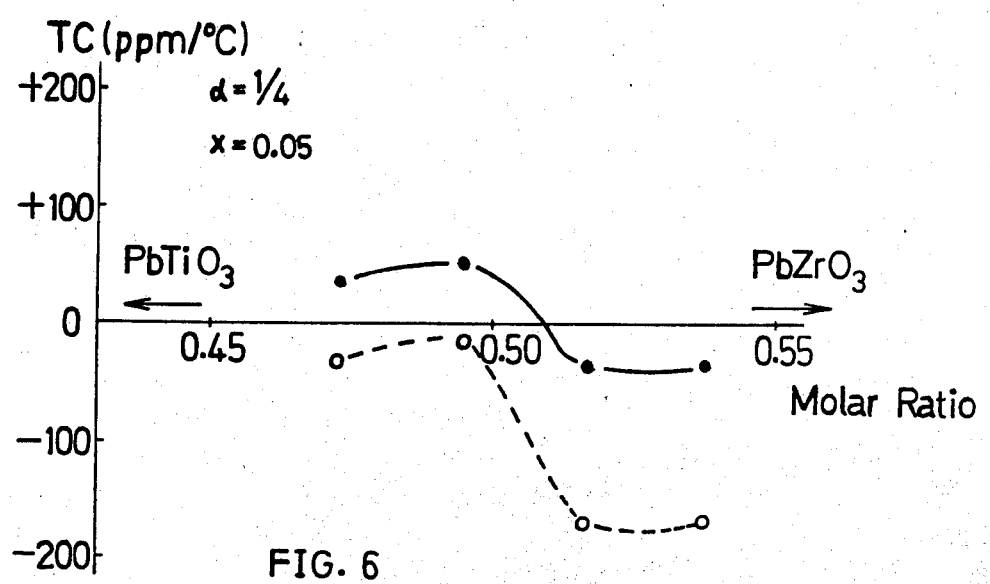

The compounds PbO (or Pb$_3$O$_4$), SnO$_2$, Sb$_2$O$_3$, TiO$_2$ and ZrO$_2$ were used as raw materials. These raw materials were individually weighed to obtain a mixture having the compositional proportions shown in Table 1, and then mixed by the wet process for about 20 hours. After drying, the resultant mixture was presintered at about 750° – 850°C for 2 hours. The presintered body was milled by the wet process with a suitable organic binder for 10 to 20 hours, dried and passed through as 80 mesh sieve to obtain minus sieve powder. The thus obtained powder was molded into a disk with a diameter of 22 mm and a thickness of 1.2 mm at a pressure of 750 – 1000 kg/cm$^2$ and then sintered at a temperature of 1150° – 1250°C for 2 hours in order to obtain a sample of the piezoelectric ceramics.

Table 1

| Sample No. | | Composition (Mol fraction) | | |
|---|---|---|---|---|
| | | α | x | y | z |
| 1 | * | 1 | 0.03 | 0.44 | 0.53 |
| 2 | * | 1 | 0.03 | 0.46 | 0.51 |
| 3 | * | 1 | 0.03 | 0.48 | 0.49 |
| 4 | * | 1 | 0.03 | 0.50 | 0.47 |
| 5 | * | 1 | 0.05 | 0.44 | 0.51 |
| 6 | * | 1 | 0.05 | 0.46 | 0.49 |
| 7 | * | 1 | 0.05 | 0.48 | 0.47 |
| 8 | * | 1 | 0.05 | 0.50 | 0.45 |
| 9 | * | 1 | 0.10 | 0.44 | 0.46 |
| 10 | * | 1 | 0.10 | 0.46 | 0.44 |
| 11 | * | 1 | 0.10 | 0.48 | 0.42 |
| 12 | * | 1 | 0.10 | 0.50 | 0.40 |
| 13 | A | ¾ | 0.01 | 0.60 | 0.39 |
| 14 | B | ¾ | 0.01 | 0.30 | 0.69 |
| 15 | | ¾ | 0.03 | 0.44 | 0.53 |
| 16 | | ¾ | 0.03 | 0.50 | 0.47 |
| 17 | | ¾ | 0.05 | 0.44 | 0.51 |
| 18 | | ¾ | 0.05 | 0.50 | 0.45 |
| 19 | | ¾ | 0.10 | 0.44 | 0.46 |
| 20 | | ¾ | 0.10 | 0.50 | 0.40 |
| 21 | C | ¾ | 0.15 | 0.25 | 0.60 |
| 22 | F | ¾ | 0.15 | 0.60 | 0.25 |
| 23 | D | ¾ | 0.25 | 0.25 | 0.50 |
| 24 | E | ¾ | 0.25 | 0.50 | 0.25 |
| 25 | A | ⅔ | 0.01 | 0.60 | 0.39 |
| 26 | B | ⅔ | 0.01 | 0.30 | 0.69 |
| 27 | | ⅔ | 0.01 | 0.44 | 0.55 |
| 28 | | ⅔ | 0.01 | 0.46 | 0.53 |
| 29 | | ⅔ | 0.01 | 0.48 | 0.51 |
| 30 | | ⅔ | 0.01 | 0.50 | 0.49 |
| 31 | | ⅔ | 0.03 | 0.44 | 0.53 |
| 32 | | ⅔ | 0.03 | 0.46 | 0.51 |
| 33 | | ⅔ | 0.03 | 0.48 | 0.49 |
| 34 | | ⅔ | 0.03 | 0.50 | 0.47 |
| 35 | | ⅔ | 0.05 | 0.44 | 0.51 |
| 36 | | ⅔ | 0.05 | 0.46 | 0.49 |
| 37 | | ⅔ | 0.05 | 0.48 | 0.47 |
| 38 | | ⅔ | 0.05 | 0.50 | 0.45 |
| 39 | | ⅔ | 0.06 | 0.44 | 0.50 |
| 40 | | ⅔ | 0.06 | 0.46 | 0.48 |
| 41 | | ⅔ | 0.06 | 0.48 | 0.46 |
| 42 | | ⅔ | 0.06 | 0.50 | 0.44 |
| 43 | | ⅔ | 0.08 | 0.44 | 0.48 |
| 44 | | ⅔ | 0.08 | 0.46 | 0.46 |
| 45 | | ⅔ | 0.08 | 0.48 | 0.44 |
| 46 | | ⅔ | 0.08 | 0.50 | 0.42 |
| 47 | | ⅔ | 0.10 | 0.44 | 0.46 |
| 48 | | ⅔ | 0.10 | 0.46 | 0.44 |
| 49 | | ⅔ | 0.10 | 0.48 | 0.42 |
| 50 | | ⅔ | 0.10 | 0.50 | 0.40 |
| 51 | C | ⅔ | 0.15 | 0.25 | 0.60 |
| 52 | F | ⅔ | 0.15 | 0.60 | 0.25 |
| 53 | D | ⅔ | 0.20 | 0.25 | 0.55 |
| 54 | E | ⅔ | 0.20 | 0.55 | 0.25 |
| 55 | A | ½ | 0.01 | 0.60 | 0.39 |
| 56 | B | ½ | 0.01 | 0.30 | 0.69 |
| 57 | | ½ | 0.02 | 0.42 | 0.56 |
| 58 | | ½ | 0.02 | 0.44 | 0.54 |
| 59 | | ½ | 0.02 | 0.46 | 0.52 |
| 60 | | ½ | 0.02 | 0.48 | 0.50 |
| 61 | | ½ | 0.02 | 0.50 | 0.48 |
| 62 | | ½ | 0.03 | 0.42 | 0.55 |
| 63 | | ½ | 0.03 | 0.43 | 0.54 |
| 64 | | ½ | 0.03 | 0.44 | 0.53 |
| 65 | | ½ | 0.03 | 0.45 | 0.52 |
| 66 | | ½ | 0.03 | 0.46 | 0.51 |
| 67 | | ½ | 0.03 | 0.47 | 0.50 |
| 68 | | ½ | 0.03 | 0.48 | 0.49 |
| 69 | | ½ | 0.03 | 0.49 | 0.48 |
| 70 | | ½ | 0.03 | 0.50 | 0.47 |
| 71 | | ½ | 0.03 | 0.51 | 0.46 |
| 72 | | ½ | 0.03 | 0.52 | 0.45 |
| 73 | | ½ | 0.04 | 0.42 | 0.54 |
| 74 | | ½ | 0.04 | 0.44 | 0.52 |
| 75 | | ½ | 0.04 | 0.46 | 0.50 |
| 76 | | ½ | 0.04 | 0.48 | 0.48 |
| 77 | | ½ | 0.04 | 0.50 | 0.46 |
| 78 | | ½ | 0.05 | 0.42 | 0.53 |
| 79 | | ½ | 0.05 | 0.43 | 0.52 |
| 80 | | ½ | 0.05 | 0.44 | 0.51 |
| 81 | | ½ | 0.05 | 0.45 | 0.50 |
| 82 | | ½ | 0.05 | 0.46 | 0.49 |
| 83 | | ½ | 0.05 | 0.47 | 0.48 |
| 84 | | ½ | 0.05 | 0.48 | 0.47 |
| 85 | | ½ | 0.05 | 0.49 | 0.46 |
| 86 | | ½ | 0.05 | 0.50 | 0.45 |
| 87 | | ½ | 0.05 | 0.51 | 0.44 |

Table 1-continued

| Sample No. | | Composition (Mol fraction) | | |
|---|---|---|---|---|
| | | α | x | y | z |
| 88 | | ½ | 0.05 | 0.52 | 0.43 |
| 89 | | ½ | 0.06 | 0.42 | 0.52 |
| 90 | | ½ | 0.06 | 0.44 | 0.50 |
| 91 | | ½ | 0.06 | 0.46 | 0.48 |
| 92 | | ½ | 0.06 | 0.48 | 0.46 |
| 93 | | ½ | 0.06 | 0.50 | 0.44 |
| 94 | | ½ | 0.10 | 0.44 | 0.46 |
| 95 | | ½ | 0.10 | 0.46 | 0.44 |
| 96 | | ½ | 0.10 | 0.48 | 0.42 |
| 97 | | ½ | 0.10 | 0.50 | 0.40 |
| 98 | C | ½ | 0.15 | 0.25 | 0.60 |
| 99 | F | ½ | 0.15 | 0.60 | 0.25 |
| 100 | D | ½ | 0.25 | 0.25 | 0.50 |
| 101 | E | ½ | 0.25 | 0.50 | 0.25 |
| 102 | A | ⅓ | 0.01 | 0.60 | 0.39 |
| 103 | B | ⅓ | 0.01 | 0.30 | 0.69 |
| 104 | | ⅓ | 0.01 | 0.44 | 0.55 |
| 105 | | ⅓ | 0.01 | 0.46 | 0.53 |
| 106 | | ⅓ | 0.01 | 0.48 | 0.51 |
| 107 | | ⅓ | 0.01 | 0.50 | 0.49 |
| 108 | | ⅓ | 0.03 | 0.44 | 0.53 |
| 109 | | ⅓ | 0.03 | 0.46 | 0.51 |
| 110 | | ⅓ | 0.03 | 0.48 | 0.49 |
| 111 | | ⅓ | 0.03 | 0.50 | 0.47 |
| 112 | | ⅓ | 0.05 | 0.44 | 0.51 |
| 113 | | ⅓ | 0.05 | 0.46 | 0.49 |
| 114 | | ⅓ | 0.05 | 0.48 | 0.47 |
| 115 | | ⅓ | 0.05 | 0.50 | 0.45 |
| 116 | | ⅓ | 0.06 | 0.44 | 0.50 |
| 117 | | ⅓ | 0.06 | 0.46 | 0.48 |
| 118 | | ⅓ | 0.06 | 0.48 | 0.46 |
| 119 | | ⅓ | 0.06 | 0.50 | 0.44 |
| 120 | | ⅓ | 0.08 | 0.44 | 0.48 |
| 121 | | ⅓ | 0.08 | 0.46 | 0.46 |
| 122 | | ⅓ | 0.08 | 0.48 | 0.44 |
| 123 | | ⅓ | 0.08 | 0.50 | 0.42 |
| 124 | | ⅓ | 0.10 | 0.44 | 0.46 |
| 125 | | ⅓ | 0.10 | 0.46 | 0.44 |
| 126 | | ⅓ | 0.10 | 0.48 | 0.42 |
| 127 | | ⅓ | 0.10 | 0.50 | 0.40 |
| 128 | C | ⅓ | 0.15 | 0.25 | 0.60 |
| 129 | F | ⅓ | 0.15 | 0.60 | 0.25 |
| 130 | $D_1$ | ⅓ | 0.20 | 0.25 | 0.55 |
| 131 | $E_1$ | ⅓ | 0.20 | 0.55 | 0.25 |
| 132 | A | ¼ | 0.01 | 0.60 | 0.39 |
| 133 | B | ¼ | 0.01 | 0.30 | 0.69 |
| 134 | | ¼ | 0.03 | 0.44 | 0.53 |
| 135 | | ¼ | 0.03 | 0.50 | 0.47 |
| 136 | | ¼ | 0.05 | 0.44 | 0.51 |
| 137 | | ¼ | 0.05 | 0.50 | 0.45 |
| 138 | C | ¼ | 0.15 | 0.25 | 0.60 |
| 139 | F | ¼ | 0.15 | 0.60 | 0.25 |
| 140 | | ¼ | 0.15 | 0.44 | 0.46 |
| 141 | | ¼ | 0.15 | 0.50 | 0.40 |
| 142 | $D_2$ | ¼ | 0.15 | 0.35 | 0.50 |
| 143 | $E_2$ | ¼ | 0.15 | 0.50 | 0.35 |
| 144 | * | 0 | 0.03 | 0.44 | 0.53 |
| 145 | * | 0 | 0.03 | 0.46 | 0.51 |
| 146 | * | 0 | 0.03 | 0.48 | 0.49 |
| 147 | * | 0 | 0.03 | 0.50 | 0.47 |
| 148 | * | 0 | 0.05 | 0.44 | 0.51 |
| 149 | * | 0 | 0.05 | 0.46 | 0.49 |
| 150 | * | 0 | 0.05 | 0.48 | 0.47 |
| 151 | * | 0 | 0.05 | 0.50 | 0.45 |
| 152 | * | 0 | 0.10 | 0.44 | 0.46 |
| 153 | * | 0 | 0.10 | 0.46 | 0.44 |
| 154 | * | 0 | 0.10 | 0.48 | 0.42 |
| 155 | * | 0 | 0.10 | 0.50 | 0.40 |

Each plane of the sample was fitted with a silver electrode by stoving and then polarized in an insulating oil by applying a DC voltage of 3.0 – 4.0 KV/mm. After the poling treatment, the sample was kept in a drier for 1 hour at 150°C to carry out the first heat aging, cooled to room temperature and then kept again in the drier under the same conditions for 1 hour to carry out the second heat aging.

The heat aging is usually made just after the poling treatment in order to stabilize the electromechanical coupling coefficient of the ceramics so that the results after the second heat aging show the heat aging characteristics of the ceramics.

The measurements of the piezoelectric characteristics of the samples were made just after each heat aging to evaluate the thermostability thereof. The dielectric constant ($\epsilon_s$) was measured with a capacitance bridge, and the electromechanical coupling coefficient (kp) and the mechanical quality factor (Qm) were measured with the IRE standard circuits. Results are shown in Table 2 in which the results after the first heat aging are listed in the columns indicated by (1) and those after the second heat aging are listed in the columns indicated by (2).

The change rate of electromechanical coupling coefficient is given by the following equation:

$$\text{Change rate (\%)} = \frac{kp_1 - kp_2}{kp_1} \times 100$$

where $kp_1$ = the electromechanical coupling coefficient after the first heat aging $kp_2$ = the electromechanical coupling coefficient after the second heat aging The negative value of the change rate in Table 2 means that the value of the electromechanical coupling coefficient (kp) was increased by the second heat aging.

Results for samples Nos. 1 to 12 were excluded from Table 2 since they have relatively high values of the mechanical quality factor (Qm > 140) and show little changes in their piezoelectric characteristics such as dielectric constant, electromechanical coupling coefficient and mechanical quality factor. Results for samples Nos. 101 to 108 were also excluded from the table since sintered bodies thereof were never obtained and the resulant products exhibit no piezoelectric characteristics.

Reference samples of a soft type were prepared in the same manner as mentioned above. All of the reference samples consist of the composition of a system $0.48PbTiO_3 - 0.52PbZrO_3$ containing 1 wt % of $Nb_2O_5$. The measurements of the electromechanical coupling coefficient of these reference samples were made after each heat aging. Results are shown in Table 3 in which the results after the first heat aging are summarized in the column indicated by (1) and those after the second heat aging are summarized in the column indicated by (2). The values in the respective columns (1) and (2) are the maximum and minimum values of the results for five samples. The minimum change rate was obtained by using the maximum value in the column (2) and the minimun value in the column (1). The maximum change rate was obtained by using the maximum value in the column (1) and the minimum value in the column (2).

Table 2

| Sample No. | | Dielectric Constant $\epsilon_s$ | | Electro-Mechanical Coupling Coefficient Kp (%) | | | Mechanical Quality Factor Qm | |
|---|---|---|---|---|---|---|---|---|
| | | (1) | (2) | (1) | (2) | Change Rate(%) | (1) | (2) |
| 1 | * | 601 | — | 36.8 | — | — | 188 | — |
| 2 | * | 704 | — | 44.0 | — | — | 177 | — |
| 3 | * | 1366 | — | 46.5 | — | — | 163 | — |
| 4 | * | 989 | — | 27.8 | — | — | 182 | — |
| 5 | * | 577 | — | 38.3 | — | — | 202 | — |
| 6 | * | 686 | — | 45.7 | — | — | 184 | — |
| 7 | * | 1406 | — | 46.6 | — | — | 170 | — |
| 8 | * | 947 | — | 26.7 | — | — | 177 | — |
| 9 | * | 605 | — | 39.0 | — | — | 183 | — |
| 10 | * | 758 | — | 46.4 | — | — | 194 | — |
| 11 | * | 1361 | — | 38.6 | — | — | 143 | — |
| 12 | * | 1028 | — | 31.7 | — | — | 173 | — |
| 13 | A | 641 | 634 | 22.3 | 21.1 | 5.4 | 98 | 98 |
| 14 | B | 635 | 629 | 29.7 | 29.3 | 1.3 | 103 | 105 |
| 15 | | 643 | 632 | 50.3 | 48.5 | 3.6 | 152 | 149 |
| 16 | | 1033 | 1021 | 31.2 | 30.7 | 1.6 | 99 | 108 |
| 17 | | 701 | 677 | 45.9 | 43.8 | 4.6 | 143 | 153 |
| 18 | | 1153 | 1113 | 35.6 | 33.0 | 7.3 | 86 | 88 |
| 19 | | 709 | 708 | 47.8 | 46.4 | 2.9 | 123 | 137 |
| 20 | | 1243 | 1235 | 39.3 | 37.2 | 5.3 | 89 | 96 |
| 21 | C | 708 | 702 | 33.2 | 31.2 | 6.0 | 100 | 103 |
| 22 | F | 731 | 735 | 32.1 | 27.5 | 14.3 | 111 | 115 |
| 23 | D | 1018 | 1021 | 25.3 | 21.8 | 13.8 | 128 | 137 |
| 24 | E | 1103 | 1121 | 24.1 | 23.3 | 3.3 | 126 | 126 |
| 25 | A | 613 | 600 | 25.4 | 22.2 | 12.6 | 89 | 83 |
| 26 | B | 597 | 598 | 23.1 | 20.3 | 12.1 | 82 | 85 |
| 27 | | 622 | 626 | 32.1 | 32.4 | −0.9 | 94 | 116 |
| 28 | | 766 | 788 | 33.5 | 33.5 | 0.0 | 78 | 94 |
| 29 | | 966 | 959 | 19.2 | 22.0 | −14.6 | 87 | 93 |
| 30 | | 761 | 753 | 18.9 | 20.0 | −5.8 | 81 | 88 |
| 31 | | 672 | 661 | 49.5 | 50.5 | −2.0 | 99 | 99 |
| 32 | | 826 | 807 | 58.0 | 52.5 | 9.5 | 86 | 84 |
| 33 | | 1556 | 1556 | 45.7 | 46.0 | −0.7 | 81 | 85 |
| 34 | | 1077 | 1068 | 33.8 | 33.7 | 0.3 | 78 | 93 |
| 35 | | 788 | 777 | 56.8 | 54.4 | 4.2 | 83 | 90 |
| 36 | | 994 | 995 | 66.5 | 69.0 | −3.8 | 82 | 82 |
| 37 | | 1667 | 1689 | 56.1 | 55.5 | 1.1 | 88 | 91 |
| 38 | | 1228 | 1223 | 43.7 | 43.9 | −0.5 | 97 | 99 |
| 39 | | 795 | 783 | 57.2 | 54.3 | 5.1 | 84 | 90 |
| 40 | | 994 | 990 | 65.8 | 62.0 | 5.8 | 76 | 84 |
| 41 | | 1672 | 1658 | 57.8 | 56.1 | 2.9 | 79 | 85 |
| 42 | | 1267 | 1247 | 44.5 | 44.0 | 1.1 | 90 | 98 |
| 43 | | 878 | 857 | 56.0 | 52.6 | 6.1 | 81 | 90 |
| 44 | | 1207 | 1200 | 66.0 | 62.0 | 6.1 | 71 | 80 |
| 45 | | 1685 | 1663 | 56.0 | 54.5 | 2.7 | 73 | 79 |
| 46 | | 1275 | 1261 | 46.5 | 46.0 | 1.1 | 87 | 95 |
| 47 | | 890 | 897 | 44.2 | 44.0 | 0.5 | 83 | 85 |
| 48 | | 1231 | 1245 | 46.3 | 45.1 | 2.6 | 80 | 82 |

Table 2-continued

| Sample No. | | Dielectric Constant $\epsilon_s$ | | Electro-Mechanical Coupling Coefficient Kp (%) | | | Mechanical Quality Factor Qm | |
|---|---|---|---|---|---|---|---|---|
| | | (1) | (2) | (1) | (2) | Change Rate(%) | (1) | (2) |
| 49 | | 1701 | 1693 | 50.3 | 48.9 | 2.8 | 73 | 77 |
| 50 | | 1258 | 1249 | 43.2 | 42.1 | 2.5 | 85 | 89 |
| 51 | C | 683 | 664 | 21.1 | 20.1 | 4.7 | 88 | 92 |
| 52 | F | 813 | 795 | 27.5 | 26.5 | 3.6 | 93 | 99 |
| 53 | D | 962 | 978 | 29.0 | 28.9 | 0.3 | 100 | 102 |
| 54 | E | 998 | 1001 | 26.3 | 25.5 | 3.0 | 100 | 97 |
| 55 | | 596 | 592 | 23.6 | 23.8 | 0.8 | 92 | 95 |
| 56 | | 389 | 394 | 25.9 | 26.3 | 1.5 | 103 | 100 |
| 57 | | 604 | 600 | 39.6 | 39.5 | 0.3 | 97 | 81 |
| 58 | | 678 | 679 | 48.2 | 48.2 | 0.0 | 87 | 92 |
| 59 | | 875 | 880 | 55.0 | 55.1 | 0.2 | 68 | 82 |
| 60 | | 1544 | 1549 | 45.3 | 45.7 | 0.9 | 60 | 77 |
| 61 | | 1057 | 1058 | 33.6 | 34.0 | 1.2 | 66 | 82 |
| 62 | | 682 | 681 | 49.0 | 48.8 | 0.4 | 98 | 95 |
| 63 | | 730 | 726 | 44.1 | 44.0 | 0.2 | 80 | 79 |
| 64 | | 713 | 699 | 57.9 | 58.0 | 0.2 | 90 | 89 |
| 65 | | 835 | 835 | 61.6 | 61.2 | 0.6 | 78 | 81 |
| 66 | | 905 | 900 | 61.7 | 61.8 | 0.2 | 84 | 80 |
| 67 | | 1581 | 1610 | 63.7 | 63.5 | 0.3 | 60 | 76 |
| 68 | | 1725 | 1737 | 54.9 | 55.9 | 1.8 | 82 | 68 |
| 69 | | 1393 | 1396 | 46.0 | 46.1 | 0.2 | 74 | 83 |
| 70 | | 1292 | 1353 | 42.4 | 43.2 | 1.9 | 90 | 85 |
| 71 | | 1067 | 1067 | 36.7 | 36.8 | 0.3 | 95 | 96 |
| 72 | | 911 | 913 | 30.5 | 31.0 | 1.6 | 87 | 107 |
| 73 | | 733 | 730 | 48.5 | 47.7 | 1.6 | 84 | 92 |
| 74 | | 837 | 836 | 62.0 | 60.5 | 2.4 | 71 | 83 |
| 75 | | 1115 | 1139 | 66.4 | 65.2 | 1.8 | 58 | 74 |
| 76 | | 1632 | 1638 | 60.0 | 59.0 | 1.7 | 84 | 77 |
| 77 | | 1272 | 1266 | 46.6 | 46.4 | 0.4 | 79 | 89 |
| 78 | | 800 | 804 | 37.1 | 36.8 | 0.8 | 75 | 88 |
| 79 | | 842 | 851 | 56.8 | 54.6 | 3.8 | 79 | 90 |
| 80 | | 850 | 854 | 57.6 | 56.8 | 1.4 | 86 | 88 |
| 81 | | 979 | 999 | 63.1 | 60.9 | 3.5 | 68 | 77 |
| 82 | | 1124 | 1135 | 60.9 | 59.7 | 2.0 | 76 | 69 |
| 83 | | 1676 | 1707 | 70.0 | 68.2 | 2.9 | 58 | 73 |
| 84 | | 1612 | 1680 | 44.3 | 43.6 | 1.6 | 66 | 75 |
| 85 | | 1582 | 1583 | 57.0 | 56.7 | 0.5 | 68 | 86 |
| 86 | | 1270 | 1276 | 45.9 | 44.0 | 4.1 | 95 | 84 |
| 87 | | 1202 | 1199 | 44.5 | 44.5 | 0.0 | 84 | 100 |
| 88 | | 1061 | 1060 | 40.1 | 40.3 | 0.5 | 90 | 107 |
| 89 | | 862 | 869 | 34.9 | 34.6 | 0.9 | 94 | 98 |
| 90 | | 934 | 948 | 54.5 | 51.9 | 4.8 | 74 | 86 |
| 91 | | 1454 | 1507 | 53.4 | 55.0 | 3.0 | 70 | 74 |
| 92 | | 1772 | 1788 | 55.4 | 54.8 | 1.1 | 73 | 82 |
| 93 | | 1325 | 1332 | 42.3 | 42.1 | 0.5 | 77 | 93 |
| 94 | | 1141 | 1138 | 44.7 | 42.4 | 5.1 | 85 | 92 |
| 95 | | 1551 | 1549 | 51.9 | 48.5 | 6.6 | 73 | 78 |
| 96 | | 1440 | 1415 | 37.7 | 36.1 | 4.2 | 85 | 89 |
| 97 | | 1100 | 1087 | 32.7 | 33.1 | 1.2 | 100 | 100 |
| 98 | | 557 | 561 | 29.4 | 29.1 | 1.0 | 93 | 90 |
| 99 | | 572 | 570 | 20.8 | 20.7 | 0.5 | 112 | 111 |
| 100 | | 964 | 967 | 35.1 | 35.0 | 0.3 | 82 | 85 |
| 101 | | 825 | 821 | 22.6 | 22.4 | 0.9 | 106 | 107 |
| 102 | A | 607 | 603 | 24.5 | 22.4 | 8.6 | 92 | 81 |
| 103 | B | 632 | 615 | 27.3 | 23.8 | 12.8 | 83 | 89 |
| 104 | | 574 | 590 | 50.8 | 51.5 | −1.4 | 91 | 97 |
| 105 | | 850 | 882 | 62.5 | 63.5 | −1.6 | 77 | 74 |
| 106 | | 1397 | 1388 | 43.2 | 43.3 | −0.2 | 37 | 55 |
| 107 | | 810 | 812 | 27.5 | 29.5 | −7.3 | 58 | 74 |
| 108 | | 777 | 771 | 59.7 | 57.5 | 3.7 | 88 | 91 |
| 109 | | 1048 | 1062 | 69.0 | 65.0 | 5.8 | 81 | 81 |
| 110 | | 1639 | 1635 | 60.6 | 58.5 | 3.5 | 87 | 89 |
| 111 | | 1230 | 1221 | 45.3 | 45.0 | 0.7 | 97 | 99 |
| 112 | | 955 | 944 | 52.5 | 48.2 | 8.2 | 82 | 88 |
| 113 | | 1324 | 1319 | 50.5 | 49.0 | 3.0 | 69 | 73 |
| 114 | | 1508 | 1490 | 41.5 | 42.0 | −1.2 | 71 | 76 |
| 115 | | 1181 | 1178 | 33.3 | 33.5 | −0.6 | 84 | 84 |
| 116 | | 895 | 933 | 44.0 | 42.7 | 3.0 | 77 | 80 |
| 117 | | 1280 | 1344 | 66.6 | 63.0 | 5.4 | 62 | 64 |
| 118 | | 1630 | 1668 | 53.0 | 52.2 | 1.5 | 72 | 75 |
| 119 | | 1266 | 1286 | 43.7 | 43.1 | 1.4 | 83 | 88 |
| 120 | | 1058 | 1096 | 40.2 | 38.3 | 4.7 | 77 | 80 |
| 121 | | 1533 | 1519 | 50.0 | 48.5 | 3.0 | 75 | 72 |
| 122 | | 1341 | 1359 | 44.0 | 43.0 | 2.3 | 81 | 84 |
| 123 | | 1030 | 1042 | 37.2 | 36.8 | 1.1 | 90 | 96 |
| 124 | | 1108 | 1123 | 36.2 | 35.0 | 3.3 | 73 | 75 |
| 125 | | 1611 | 1638 | 45.9 | 44.3 | 3.5 | 70 | 77 |
| 126 | | 1404 | 1429 | 38.8 | 38.0 | 2.1 | 78 | 81 |
| 127 | | 1129 | 1105 | 32.5 | 31.5 | 3.1 | 82 | 85 |
| 128 | C | 739 | 721 | 31.2 | 29.6 | 5.1 | 79 | 82 |
| 129 | F | 853 | 831 | 33.3 | 30.2 | 9.3 | 87 | 93 |
| 130 | $D_1$ | 973 | 999 | 29.9 | 27.3 | 8.7 | 83 | 85 |
| 131 | $E_1$ | 1003 | 1012 | 28.3 | 26.5 | 6.4 | 92 | 98 |
| 132 | A | 543 | 534 | 22.1 | 21.4 | 3.2 | 93 | 70 |
| 133 | B | 421 | 401 | 25.6 | 24.8 | 3.1 | 71 | 75 |
| 134 | | 795 | 789 | 59.3 | 56.5 | 4.7 | 88 | 90 |
| 135 | | 1238 | 1226 | 43.2 | 42.3 | 2.1 | 83 | 99 |

Table 2-continued

| Sample No. | | Dielectric Constant $\epsilon_s$ | | Electro-Mechanical Coupling Coefficient Kp (%) | | | Mechanical Quality Factor Qm | |
|---|---|---|---|---|---|---|---|---|
| | | (1) | (2) | (1) | (2) | Change Rate(%) | (1) | (2) |
| 136 | | 979 | 962 | 61.1 | 50.0 | 2.2 | 89 | 88 |
| 137 | | 1121 | 1180 | 38.0 | 37.9 | 0.3 | 87 | 86 |
| 138 | C | 893 | 973 | 48.2 | 46.1 | 4.4 | 86 | 87 |
| 139 | $F_2$ | 1099 | 1121 | 45.0 | 42.2 | 6.2 | 81 | 83 |
| 140 | | 621 | 635 | 25.0 | 24.6 | 1.6 | 80 | 78 |
| 141 | | 731 | 741 | 26.2 | 25.1 | 4.2 | 75 | 81 |
| 142 | $D_2$ | 997 | 989 | 24.3 | 23.2 | 4.5 | 70 | 76 |
| 143 | $E_2$ | 1031 | 1005 | 29.5 | 27.3 | 7.5 | 80 | 87 |
| 144 | * | 878 | 869 | 56.5 | 56.0 | 0.9 | 88 | 90 |
| 145 | * | 1252 | 1267 | 68.0 | 63.0 | 7.4 | 79 | 83 |
| 146 | * | 1601 | 1590 | 54.5 | 53.5 | 1.8 | 84 | 88 |
| 147 | * | 1254 | 1237 | 46.0 | 46.0 | 0.0 | 96 | 99 |
| 148 | * | — | — | — | — | — | — | — |
| 149 | * | — | — | — | — | — | — | — |
| 150 | * | — | — | — | — | — | — | — |
| 151 | * | — | — | — | — | — | — | — |
| 152 | * | — | — | — | — | — | — | — |
| 153 | * | — | — | — | — | — | — | — |
| 154 | * | — | — | — | — | — | — | — |
| 155 | * | — | — | — | — | — | — | — |

Table 3

| Electromechanical coupling coefficient kp (%) | | Change Rate (%) |
|---|---|---|
| (1) | (2) | |
| 68 – 70 | 52 – 55 | 19 – 26 |

As will be evident from Tables 2 and 3, the ceramic compositions of the invention are scarcely changed in their piezoelectric characteristics by the repetition of the heat aging whereas the ceramic composition of the reference samples has a tendency to cause the deterioration of the electromechanical coupling coefficient by the repetition of the heat aging. Thus, it will be noted that the ceramic compositions of this invention are superior in stability to the ceramic composition of the reference samples.

The stability of the piezoelectric characteristics is very important in cases where the ceramic compositions are applied to mechanical ceramic filters, ceramic resonators, oscillators and the like.

In order to examine the utility of the ceramic compositions of the invention, the ceramic composition are applied to resonators in the following manner.

The disk obtained by the above mentioned preparation methos was ground so as to have a thickness of 0.2 mm. The thus obtained thin disk was fitted with a silver electrode layer on each plane thereof and then polarized in the same manner as mentioned above. After a poling treatment, the thin disk was provided with an opposite electrode on each plane thereof to complete the preparation of an energy trapped mode resonator having an intermediate frequency of 10.7 MHz. The resonator was coated by a well-known dip coating method.

The measurements of antiresonance and resonance frequencies of the resonator were made before and after the dip coating, whereby an examination was made as to how the difference $\Delta f$ ($=$ fa $-$ fo) between the antiresonance and resonance frequencies is affected by the heat and the clamping force caused by the hardening of the paints, both of which are applied to the resonator during dip coating. The differences $\Delta f$ before and after dip coating are shown in Table 4.

Table 4

| Sample No. | $\Delta f$ (KHz) Before dip coating | $\Delta f$ (KHz) After dip coating | Sample No. | $\Delta f$ (KHz) Before dip coating | $\Delta f$ (KHz) After dip coating |
|---|---|---|---|---|---|
| 1 | 347 | 364 | 36 | 673 | 675 |
| 2 | 453 | 461 | 37 | 611 | 621 |
| 3 | 450 | 446 | 38 | 510 | 502 |
| 4 | 150 | 134 | 39 | 631 | 626 |
| 5 | 433 | 450 | 40 | 668 | 671 |
| 6 | 511 | 523 | 41 | 676 | 686 |
| 7 | 498 | 507 | 42 | 530 | 521 |
| 8 | 135 | 143 | 43 | 560 | 567 |
| 9 | 492 | 481 | 44 | 607 | 612 |
| 10 | 573 | 585 | 45 | 638 | 649 |
| 11 | 500 | 523 | 46 | 508 | 514 |
| 12 | 210 | 249 | 47 | 465 | 467 |
| 13 | — | — | 48 | 478 | 480 |
| 14 | 180 | 175 | 49 | 515 | 518 |
| 15 | 515 | 514 | 50 | 449 | 446 |
| 16 | 216 | 212 | 51 | — | — |
| 17 | 461 | 465 | 52 | — | — |
| 18 | 253 | 270 | 53 | 170 | 165 |
| 19 | 492 | 494 | 54 | — | — |
| 20 | 373 | 366 | 55 | — | — |
| 21 | 233 | 224 | 56 | — | — |
| 22 | 119 | 127 | 57 | 293 | 309 |
| 23 | — | — | 58 | 436 | 456 |
| 24 | — | — | 59 | 515 | 546 |
| 25 | — | — | 60 | 451 | 460 |

Table 4-continued

| Sample No. | Δf (KHz) Before dip coating | Δf (KHz) After dip coating | Sample No. | Δf (KHz) Before dip coating | Δf (KHz) After dip coating |
|---|---|---|---|---|---|
| 26 | — | — | 61 | 126 | 195 |
| 27 | 253 | 247 | 62 | 459 | 471 |
| 28 | 310 | 312 | 63 | 505 | 534 |
| 29 | 231 | 249 | 64 | 505 | 526 |
| 30 | — | — | 65 | 535 | 565 |
| 31 | 600 | 601 | 66 | 545 | 558 |
| 32 | 688 | 693 | 67 | 572 | 575 |
| 33 | 661 | 660 | 68 | 586 | 596 |
| 34 | 331 | 334 | 69 | 469 | 494 |
| 35 | 607 | 608 | 70 | 424 | 424 |
| 71 | 282 | 290 | 106 | 651 | 656 |
| 72 | 265 | 270 | 107 | 230 | 245 |
| 73 | 435 | 460 | 108 | 559 | 561 |
| 74 | 540 | 563 | 109 | 639 | 648 |
| 75 | 569 | 574 | 110 | 664 | 664 |
| 76 | 597 | 598 | 111 | 500 | 509 |
| 77 | 444 | 436 | 112 | 500 | 501 |
| 78 | 357 | 367 | 113 | 415 | 414 |
| 79 | 465 | 471 | 114 | 450 | 447 |
| 80 | 509 | 518 | 115 | 350 | 354 |
| 81 | 514 | 538 | 116 | 300 | 303 |
| 82 | 529 | 533 | 117 | 635 | 640 |
| 83 | 601 | 604 | 118 | 577 | 568 |
| 84 | 450 | 451 | 119 | 500 | 499 |
| 85 | 567 | 560 | 120 | 389 | 400 |
| 86 | 450 | 451 | 121 | 542 | 540 |
| 87 | 427 | 419 | 122 | 501 | 506 |
| 88 | 328 | 318 | 123 | 211 | 220 |
| 89 | 259 | 250 | 124 | 312 | 315 |
| 90 | 467 | 464 | 125 | 468 | 471 |
| 91 | 541 | 534 | 126 | 379 | 382 |
| 92 | 561 | 561 | 127 | 218 | 233 |
| 93 | 460 | 460 | 128 | 172 | 183 |
| 94 | 417 | 377 | 129 | 199 | 200 |
| 95 | 498 | 472 | 130 | 117 | 122 |
| 96 | 392 | 390 | 131 | — | — |
| 97 | 228 | 217 | 132 | — | — |
| 98 | 207 | 200 | 133 | — | — |
| 99 | — | — | 134 | 569 | 575 |
| 100 | 234 | 231 | 135 | 450 | 448 |
| 101 | — | — | 136 | 518 | 527 |
| 102 | — | — | 137 | 361 | 380 |
| 103 | — | — | 138 | 472 | 490 |
| 104 | 580 | 578 | 139 | 400 | 448 |
| 105 | 668 | 673 | 140 | — | — |
| 141 | — | — | | | |
| 142 | — | — | | | |
| 143 | 121 | 112 | | | |
| 144 | 523 | 532 | | | |
| 145 | 549 | 558 | | | |
| 146 | 570 | 572 | | | |
| 147 | 510 | 509 | | | |
| 148 | — | — | | | |
| 149 | — | — | | | |
| 150 | — | — | | | |
| 151 | — | — | | | |
| 152 | — | — | | | |
| 153 | — | — | | | |
| 154 | — | — | | | |
| 155 | — | — | | | |
| Reference Sample | 680 | 500 | | | |

From this table, it will be seen that the ceramic compositions of the invention are scarcely influenced by the processing whereas the ceramic composition of the reference sample is greatly influenced. Thus, the ceramic compositions of the invention are useful for use as materials for resonators, mechanical ceramic filters and the like.

Experiments with respect to the samples having a low electromechanical coupling coefficient less than 25% were omitted since it was difficult to prepare the energy trapped mode resonators for 10.7 MHz.

Some of the representatives of the ceramic compositions of the invention were examined as to how the temperature coefficients (TC) of the antiresonance and resonance frequencies in a temperature range of −20°C to + 80°C vary with the change of the ratio of $PbTiO_3/PbZrO_3$ when the mol fraction of the component $Pb(Sn_\alpha Sb_{1-\alpha})O_3$ is fixed. The results are shown in FIGS. 2 through 6.

The temperature coefficients(TC) were obtained by use of the following equations:

$$TCfo = \frac{fomax - fomin}{fo\ 20}$$

$$TCfa = \frac{famax - famin}{fo\ 20}$$

where

TCfo = temperature coefficient of resonance frequency (ppm/°C)

TCfa = temperature coefficient of antiresonance frequency (ppm/°C)

fomax, famax = respective maximum values of resonance and antiresonance frequencies in a temperature range of −20°C to +80°C fomin, famin = respective minimum values of resonance

|                  |                                                                                                                 |
|------------------|-----------------------------------------------------------------------------------------------------------------|
|                  | -continued                                                                                                      |
|                  | and antiresonance frequencies in a temperature range of −20°C to +80°C                                          |
| fo 20, fa 20 =   | respective values of resonance and antiresonance frequencies at +20°C                                           |

Figure 7:
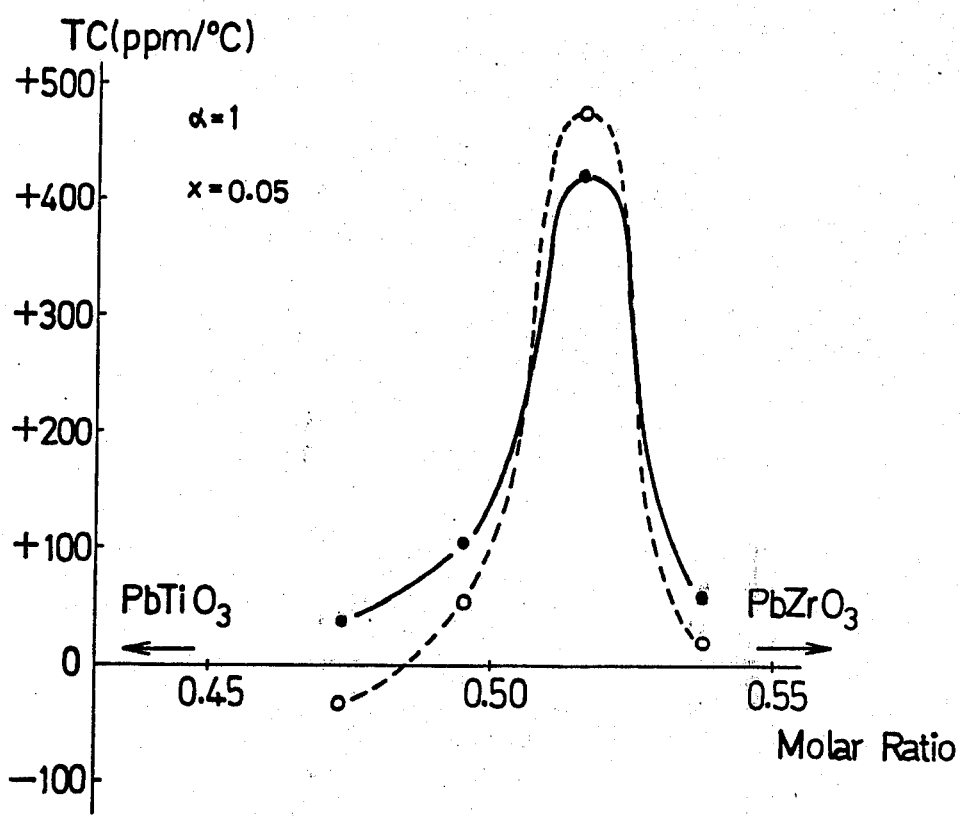

FIG. 7 shows the changes of temperature coefficients (TC) when $\alpha = 1.00$ and $x = 0.05$ as a function of the mol fractions of $PbTiO_3$ and $PbZrO_3$.

In FIGS. 2 through 7, the solid line shows the result for the antiresonance frequency and the broken line shows the result for the resonance frequency. The positive and negative signs (+) (−) of TC in these figures have respectively the following meanings. The positive sign (+) means that the value of fomax (or famax) is found at a temperature higher than the room temperature (+20°C) or that the value of fomin (or famin) is found at a temperature lower than the room temperature (+20°C). The negative sign (−) has the opposite meaning of the positive sign.

From FIGS. 2 through 6, it will be seen that good points of the temperature coefficent are present in a wide compositional area where the mol fraction of $PbZrO_3$ ranges from 0.46 to 0.51. This shows that according to the present invention the piezoelectric ceramic materials having a good temperature coefficient can be obtained with ease when designing the filters, oscillators and the like having any desired piezoelectric characteristics such as $\epsilon_s$, kp and Qm. On the contrary, the ceramic compositions beyond the limits of the compositional area of this invention (i.e. $\alpha = 1$) have large values on the positive side, as can be seen from FIG. 7. It is therefore impossible to select the composition having good temperature coefficient from these compositions.

Figure 8:
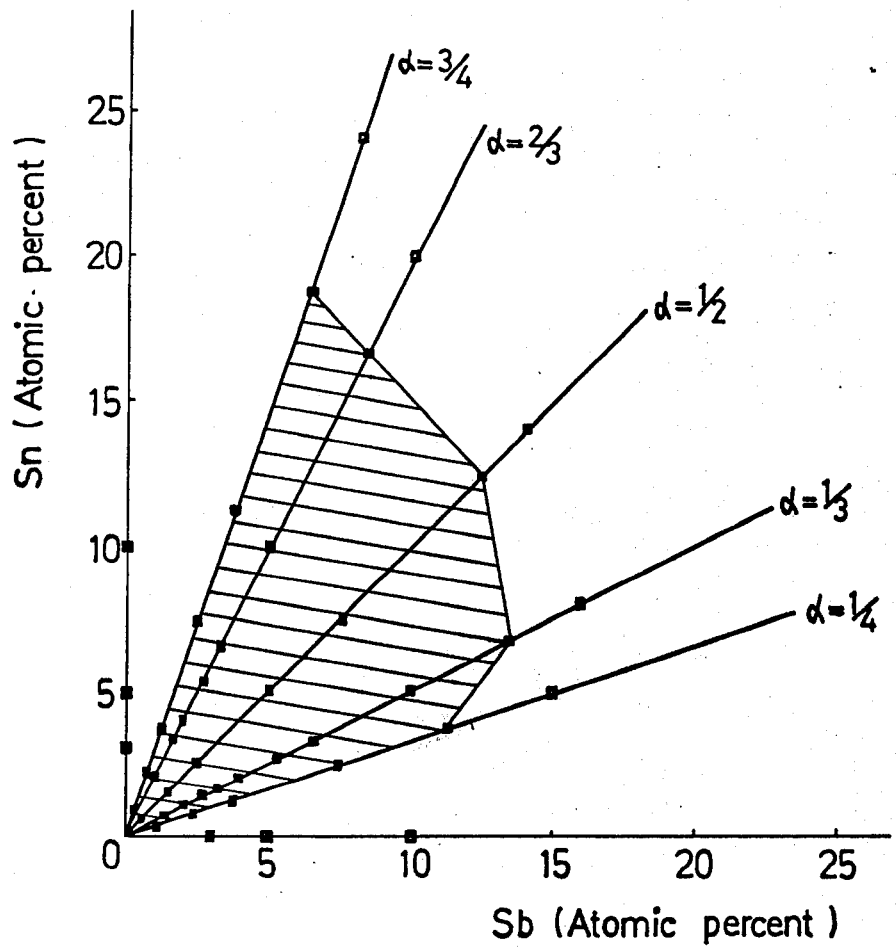
FIG. 8 is a graph showing the relation between the contents of Sn, Sb and the degree of sintering.

FIG. 8 shows the relation between the degree of sintering and the contents of Sn and Sb. In this figure, the symbol ( ∗ ) shows the composition which was converted into a fine structural sintered body and the symbol ( □ ) shows the composition which was never converted into a sintered body.

From this figure, it will be seen that the compositional area where the fine structural sintered body can be obtained decreases with the decrease of the content of Sn. It will be also seen that if the content of Sb is more than 5 atomic percent when the content of Sn is zero, the fine structural sintered body is never obtained.

The area of the present composition has been described as being in the polygonal area defined by the points A, B, C, D, E and F in FIG. 1 for the following reasons. If the content of $Pb(Sn_\alpha Sb_{1-\alpha})O_3$ is less than 1 mol percent when $\frac{1}{4} \leq \alpha \leq \frac{3}{4}$, the temperature coefficient of the composition becomes great. Further, if the content of $Pb(Sn_\alpha Sb_{1-\alpha})O_3$ is more than 25 mol percent when $\frac{1}{2} \leq \alpha \leq \frac{3}{4}$, or more than 20 mol percent when $\frac{1}{3} \leq \alpha < \frac{1}{2}$, or more than 15 mol percent when $\frac{1}{4} \leq \alpha < \frac{1}{3}$, the electromechanical coupling coefficient of the composition becomes less than 20% and varies greatly by the heat aging. In addition, if the content of $PbTiO_3$ is more than 60 mol percent or if the content of $PbZrO_3$ is more than 69 mol percent, the electromechanical coupling coefficient of the composition becomes less than 20 %.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A ferroelectric ceramic composition of the ternary system $Pb(Sn_x Sb_{1-301})O_3$—$PbTiO_3$—$PbZrO_3$ comprising a solid solution represented by the general formula:

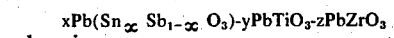

wherein
$x + y + z = 1.00$ and
$\frac{1}{2} \leq \alpha \leq \frac{3}{4}$, said composition being in a polygonal area defined by the points A, B, C, D, E and F in FIG. 1, the sets of mole fractions of the three components at said points being as follows:

| x    | y    | z    |
|------|------|------|
| 0.01 | 0.60 | 0.39 |
| 0.01 | 0.30 | 0.69 |
| 0.15 | 0.25 | 0.60 |
| 0.25 | 0.25 | 0.50 |
| 0.25 | 0.50 | 0.25 |
| 0.15 | 0.60 | 0.25 |

2. The ferroelectric ceramic composition according to claim 1 wherein $\alpha$ is ¾.

3. The ferroelectric ceramic composition according to claim 1 wherein $\alpha$ is ⅔.

4. The ferroelectric ceramic composition according to claim 1 wherein $\alpha$ is ½.

5. A ferroelectric ceramic composition of the ternary system $Pb(Sn_x Sb_{1-x})O_3$—$PbTiO_3$—$PbZrO_3$ comprising a solid solution represented by the general formula:

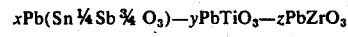

wherein $x + y + z = 1.00$, said composition being in a polygonal area defined by the points A, B, C, D₂, E₂ and F in FIG. 1, the sets of mole fractions of the three components at said points being as follows:

| x    | y    | z    |
|------|------|------|
| 0.01 | 0.60 | 0.39 |
| 0.01 | 0.30 | 0.69 |
| 0.15 | 0.25 | 0.60 |
| 0.15 | 0.35 | 0.50 |
| 0.15 | 0.50 | 0.35 |
| 0.15 | 0.60 | 0.25 |

* * * * *

UNITED STATES PATENT AND TRADEMARK OFFICE
CERTIFICATE OF CORRECTION

PATENT NO. : 3,970,572
DATED : July 20, 1976
INVENTOR(S) : Toshio OGAWA et al

It is certified that error appears in the above-identified patent and that said Letters Patent are hereby corrected as shown below:

IN THE HEADING OF THE PATENT:

In the list of Inventors, the name of the second inventor should read -- Mutuo Munekata --

Signed and Sealed this second Day of August 1977

[SEAL]

Attest:

RUTH C. MASON
*Attesting Officer*

C. MARSHALL DANN
*Commissioner of Patents and Trademarks*